United States Patent [19]

Caslavsky et al.

[11] 4,096,025

[45] Jun. 20, 1978

[54] METHOD OF ORIENTING SEED CRYSTALS IN A MELT, AND PRODUCT OBTAINED THEREBY

[75] Inventors: Jarda L. Caslavsky, Lexington; Frederick Schmid, Marblehead; Charles P. Gazzara, Reading; Dennis J. Viechnicki, Wellesley; James W. McCauley, Wakefield, all of Mass.

[73] Assignee: The United States of America as represented by the Secretary of the Army, Washington, D.C.

[21] Appl. No.: 589,317

[22] Filed: Jun. 23, 1975

Related U.S. Application Data

[63] Continuation-in-part of Ser. No. 444,442, Feb. 21, 1974, abandoned, which is a continuation-in-part of Ser. No. 276,213, Jul. 28, 1972, abandoned.

[51] Int. Cl.$^2$ .......................... B01J 17/08; C01F 7/02
[52] U.S. Cl. ...................... 156/616 R; 156/DIG. 61; 156/DIG. 65; 23/305 A; 106/42; 106/65; 106/73.4; 423/625
[58] Field of Search ............. 23/305 A; 156/DIG. 61, 156/DIG. 65, 616 R, 617 R, 617 H; 106/42, 65, 73.4

[56] References Cited

U.S. PATENT DOCUMENTS

| | | | |
|---|---|---|---|
| 2,979,413 | 4/1961 | Ballman | 106/42 |
| 3,011,870 | 12/1961 | Webb | 156/DIG. 61 |
| 3,075,831 | 1/1963 | Remeika | 156/DIG. 61 |
| 3,527,574 | 9/1970 | La Belle, Jr. | 156/DIG. 61 |
| 3,598,169 | 8/1971 | Copley | 156/616 |
| 3,608,050 | 9/1971 | Carman | 106/42 |
| 3,653,432 | 4/1972 | Schmid | 165/61 |
| 3,715,194 | 2/1973 | Plooster | 156/DIG. 61 |
| 3,898,051 | 8/1975 | Schmid | 156/616 |

FOREIGN PATENT DOCUMENTS

| | | | |
|---|---|---|---|
| 838,575 | 6/1960 | United Kingdom | 156/DIG. 61 |

OTHER PUBLICATIONS

Kronberg: Plastic Deformation of Sapphire, Arta Metallurgica, vol. 5, 1957, pp. 508 to 5244 Dwg.
Sahagian et al., Crystal Perfection of $\alpha$-Al$_2$O$_3$ as a Function of Growth Method, Conf. on Growth of Crystals, USSR, (20-21, Jul. 1966), pp. 183-194.
Yamamoto, et al., Sci. Rep. Res. Inst. Tohokio Univ. A, (Japan), vol. 22, #4, Feb. 1971, pp. 156-164.

*Primary Examiner*—Stephen J. Emery
*Attorney, Agent, or Firm*—Nathan Edelberg; Robert P. Gibson

[57] ABSTRACT

A method for the production of improved, transparent single crystals having a corundum structure under conditions of minimum thermal strain, comprising the optimum orientation of growth planes of a seed crystal in a melt substantially parallel to the vertical side wall means of a crucible, and heating and subsequent cooling the melt, thereby nucleating on the seed crystal.

4 Claims, 4 Drawing Figures

METHOD OF ORIENTING SEED CRYSTALS IN A MELT, AND PRODUCT OBTAINED THEREBY

This is a continuation-in-part of our copending application, Ser. No. 444,442, filed Feb. 21, 1974, now abandoned, which is a continuation-in-part of copending application, Ser. No. 276,213, filed July 28, 1972, now abandoned, and assigned to the same assignee as this application, the Government of the United States as represented by the Secretary of the Army.

STATEMENT OF GOVERNMENT INTEREST

The invention described herein may be manufactured, used, and licensed by or for the Government for Governmental purposes without the payment to us of any royalty thereon.

SUMMARY OF THE INVENTION

This invention relates to a method for growing large, transparent single crystals having a corundum structure by the orientation of a seed.

Prior attempts to grow single transparent crystals having corundum structure have resulted in the development of mosaic patterns and severe cracking in the crystal. After considerable investigation, it was decided to orient a seed in a melt so that the slip plane in the crystal system would absorb the stresses in the growth of the crystal.

The present technique of orienting seeds is operable for any melting procedure involving a crystal fixed in a crucible. For example, the present method can be utilized in conjunction with the Stockbarger, Bridgman and other crystal growing procedures wherein the material to be grown is melted in a crucible and allowed to cool nucleating on a seed. The present method was carried out in conjunction with the procedure of Frederick Schmid et al, which is the subject of U.S. Pat. No. 3,653,432, issued Apr. 4, 1972, assigned to the same assignee as this application, namely, the Government of the United States as represented by the Secretary of the Army.

It is an object of this invention to provide a method for growing improved transparent single crystals having a corundum structure.

It is a further object of this invention to provide and disclose a method for growing improved transparent single crystals having a corundum structure by orienting a seed crystal in a melt so that the slip planes of the resulting growing crystal absorb the induced stresses.

It is further object of this invention to provide and disclose a method for growing improved transparent single crystals of sapphire by orienting a seed crystal in a melt so that the slip planes of the resultant growing crystal absorb the induced stresses, by releasing the thermal strain created during the cooling period.

It is still a further object of this invention to provide an artificially grown large transparent substantially colorless corundum (sapphire) crystal, suitable for important technological and armament uses as, for instance, transparent armor for eye protection against hostile fire.

The method of crystal growth described in the above mentioned Schmid et al U.S. Pat. No. 3,653,432, involved the sequential heating and cooling of the growing crystal in a crucible. In the case of corundum or sapphire crystals, the thermogradient thus introduced has a tendency of causing deformation of the growing crystal by expansion and contraction. The heated crucible blocks the growing crystal and introduces a thermostrain therein, which has a tendency of causing a large percentage of the crystals to crack upon cooling or upon imposition of a sudden thermal or mechanical shock. When the artificially grown crystal is to be used in a transparent armor for eye protection, it is very important that there be no random failures due to internal stresses introduced in the crystal during growing.

Our solution of these and other technological problems posed by the growing of corundum or sapphire crystals essentially comprises the provision of a specially cut corundum or sapphire seed crystal (sapphire being our preferred species of corundum) with six growth planes and its orientation in a vertical walled crucible so that four of the growth planes of the seed crystal are substantially parallel to the vertical side wall of the crucible. The crucible is then filled with solidified premelted corundum or sapphire material, and crystal growth in the crucible is effected in accordance with the heating and cooling process of the Schmid et al U.S. Pat. No. 3,653,432. The optimum orientation of the seed crystal in the crucible in accordance with the present invention places the slip planes of the seed crystal and of the growing crystal into suitable positions relative to the bottom and side walls of the crucible. In this manner, the thermal strain on the growing crystal in the crucible and the resulting risk of failure are minimized.

A fuller understanding of the invention may be ascertained by referring to the following description and claims taken in conjunction with the accompanying drawings.

DESCRIPTION OF A PREFERRED EMBODIMENT

Figure 1:
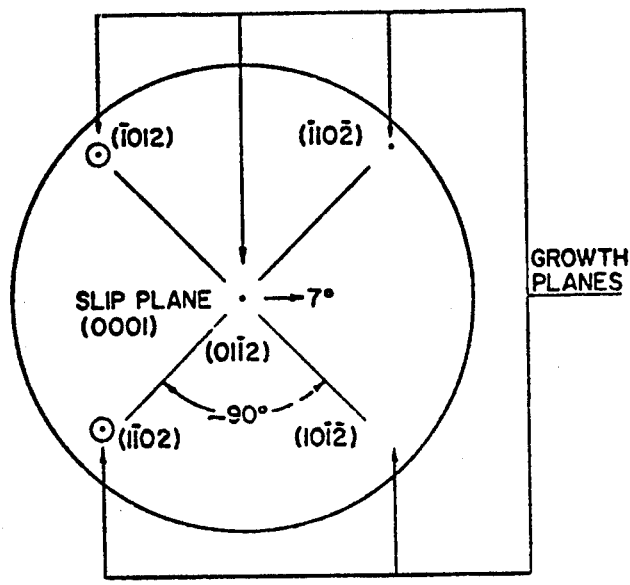
FIG. 1 is a schematic illustration of the method of the present invention comprising the optimum initial orientation of a (0001) slip plane of a seed crystal related to the bottom of a crucible as well as the further orientation of ($\bar{1}10\bar{2}$) growth planes relative to the side wall of the crucible.
Figure 2:
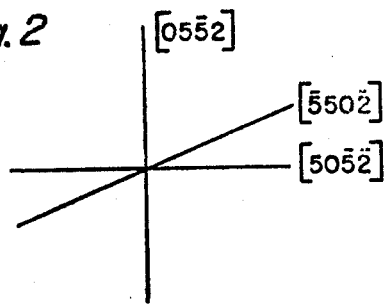
FIG. 2 is a schematic illustration of the directions of the growth planes of a seed crystal of the present invention.
Figure 3:
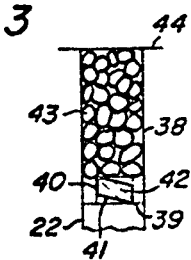
FIG. 3 is a schematic view (not to scale) of a crucible containing solidified premelt corundum (sapphire) and an oriented corundum (sapphire) seed crystal in accordance with our invention prior to the application of controlled heating and cooling in accordance with the same invention.

In a specific example an $Al_2O_3$ hexagonal corundum preferably sapphire seed crystal 40 generally resembling a cylindrical disc is cut with proper axis orientation from a bar stock of any available sapphire single crystal so that its growth planes are ($01\bar{1}2$), ($\bar{1}10\bar{2}$), ($10\bar{1}\bar{2}$), ($0\bar{1}1\bar{2}$), ($\bar{1}102$) and ($\bar{1}012$), as is generally shown in FIG. 1. The above indices refer to the x-ray diffraction hexagonal unit cell. The seed crystal 40 is initially oriented in a crucible having vertical wall means 38 and a horizontal bottom 39. The initial orientation of the seed crystal is corrected by cutting, so that growth planes ($01\bar{1}2$) and ($0\bar{1}1\bar{2}$) (41 in FIG. 3) are tilted approximately 7° to the horizontal bottom 39 (FIG. 3) of the crucible. This orients the four other growth planes ($\bar{1}10\bar{2}$), ($10\bar{1}\bar{2}$), ($1\bar{1}02$) and ($\bar{1}012$) (42 in FIG. 3) substantially parallel to the vertical wall means 38 (FIG. 3) of the crucible. Since the growth planes 42 (FIG. 3) are approximately 90° from each other and from the stereographic center of the crystal, the growth velocities will be isotropic so that the growing crystal will fill the crucible evenly, which minimizes the constraints on the growing crystal, thereby reducing stresses therein.

After proper orientation of the seed crystal, the crucible is filled with solidified premelted $Al_2O_3$ ceramic material 43, such as corundum or industrial sapphire. The open end of crucible 38 is then covered with a sheet 44 of molybdenum, and the covered crucible is positioned in a gradient vacuum furnace as schematically shown in FIG. 1 of U.S. Pat. No. 3,653,432, Schmid et al. The base of the loaded crucible is seated directly on a heat exchanger 22 as is shown schematically in FIG. 3 of the present drawing. After the furnace has been evacuated to $5 \times 10^{-2}$ torr, the furnace power is turned on and helium is bled into the heat exchanger at a slow rate, about 4 cubic feet per hour (cfh) in order to prevent oxidation of the metal heat exchanger. The temperature of the furnace is increased at a sufficiently slow rate, about 11° C/min, to prevent the pressure in the furnace from exceeding $2 \times 10^{-1}$ torr. As the melting point of the material is reached, the flow of helium into the heat exchanger is increased to about 40 cfh to prevent the melt from boiling over the top of the crucible when melting occurs and also to prevent the seed from melting. The temperature of the melt is then further increased somewhat, e.g., to about 50° C above the melting point of the $Al_2O_3$, i.e., to a temperature of about 2100° C. The helium flow is then decreased, to about 8 cfh to permit partial melting of the seed crystal to a substantially hemispherical shape. When solidification commences, the solid nucleates and thereby grows on the seed in a hemispherical fashion and assumes the crystallographic orientation of the seed. The temperature of the center of the seed is not allowed to increase above the melting point of the material by controlling the flow of helium into the heat exchanger. To start the growing process, the flow of helium is increased gradually in small increments (about 0.5 cfh/min), to about 100 cfh to extract heat from the melt in a controlled fashion so that the solid grows from the seed crystal. The melt temperature is then decreased at a rate of 2° C/min by decreasing the furnace power until a temperature 30° below the melting point of the material is reached. This temperature is maintained while the flow of helium is decreased at a rate of 2 cfh/min until a slow flow, about 4 cfh, necessary to prevent oxidation of the heat exchange is reached. The furnace power is then further reduced and the single crystal allowed to cool to 50° C in a period of 16 hours.

The degree of success of the present method is exemplified by the fact that before the seeds were oriented in the manner described, the percentage yield of usable sapphire crystals was 20%. With the introduction of the crystal seeds oriented as described, seven usable sapphire crystals of about 3 inches in diameter have been produced in seven attempts. The present crystals were examined utilizing an optical polariscope, and a Laue backreflection camera and were found to be superior in optical transparency and free from defects in comparison to prior art single crystals.

Figure 4:
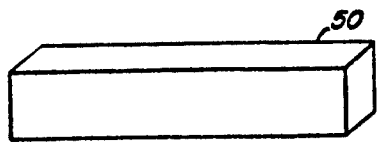
FIG. 4 is a perspective view (not to scale) of a transparent crystal grown in accordance with our invention, shaped as a transparent armor for eye protection.

It is envisaged that the produced, single, transparent crystals can be utilized as crystals for lasers, armor, bearings, etc. A prismatic transparent eye armor pane 50, adapted for use in a tank window slit, is shown in FIG. 4 of the drawings; this pane was shaped by cutting from a 3 inches large corundum, namely, sapphire crystal grown by nucleation on an oriented seed crystal in accordance with the present invention. Crystals grown by the present method may also be utilized as bar stock from which additional seed crystals are cut in accordance with the teachings of the present invention, for the practice of our method.

Although we have described our invention with a certain degree of particularity, it is understood that the present disclosure has been made by way of example and that numerous changes may be made in details, without departing from the spirit and scope of our invention.

We claim:

1. In a method for the production of a large transparent single crystal of corundum having a hexagonal structure comprising the melting of said material in a crucible having a generally vertical wall and a horizontal bottom, the improvement comprising: cutting a seed crystal such that it has six growth planes ($01\bar{1}2$), ($\bar{1}10\bar{2}$), ($10\bar{1}\bar{2}$), ($0\bar{1}1\bar{2}$), ($1\bar{1}02$), and ($\bar{1}012$);

orienting said growth planes ($01\bar{1}2$) and ($0\bar{1}1\bar{2}$) of said seed crystal such that they are at an angle of about 7° to the horizontal bottom of said crucible, and said other growth planes ($\bar{1}10\bar{2}$), ($10\bar{1}\bar{2}$), ($1\bar{1}02$), and ($\bar{1}012$) of said seed crystal are oriented substantially parallel to the generally vertical wall of said crucible;

melting said seed crystal to a substantially hemispherical shape; and cooling said seed crystal and said material such that said material nucleates and grows in a substantially hemispherical fahsion and assumes the crystallographic orientation of said seed crystal which process minimizes the thermal strain on the single crystal.

2. The method according to claim 1 wherein said material is sapphire.

3. A transparent sapphire single crystal produced by the method of claim 2.

4. A transparent corundum single crystal produced by the method of claim 1.

* * * * *